United States Patent
Alameer et al.

(10) Patent No.: US 10,459,809 B2
(45) Date of Patent: Oct. 29, 2019

(54) STACKED MEMORY CHIP DEVICE WITH ENHANCED DATA PROTECTION CAPABILITY

(71) Applicant: Intel Corporation, Santa Clara, CA (US)

(72) Inventors: Hussein Alameer, Portland, OR (US); Uksong Kang, Hillsboro, OR (US); Kjersten E. Criss, Beaverton, OR (US); Rajat Agarwal, Beaverton, OR (US); Wei Wu, Portland, OR (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/640,182

(22) Filed: Jun. 30, 2017

(65) Prior Publication Data
US 2019/0004909 A1    Jan. 3, 2019

(51) Int. Cl.
*G11C 5/02*    (2006.01)
*G06F 11/16*    (2006.01)
(Continued)

(52) U.S. Cl.
CPC ...... *G06F 11/1666* (2013.01); *G06F 11/1044* (2013.01); *G11C 5/02* (2013.01); *G11C 5/025* (2013.01); *G11C 5/04* (2013.01); *G11C 7/1006* (2013.01); *G11C 7/24* (2013.01); *G11C 29/42* (2013.01); *G11C 29/52* (2013.01); *G11C 29/74* (2013.01); *H01L 25/0657* (2013.01);
(Continued)

(58) Field of Classification Search
CPC ......... G11C 5/02; G11C 7/24; G06F 11/1666; H01G 25/0657; H01L 2225/06541

USPC .......... 365/189.05, 185.02, 185.09, 200, 201
See application file for complete search history.

(56) References Cited

U.S. PATENT DOCUMENTS 6,370,611 B1    4/2002    Callison et al.
7,251,185 B2 *    7/2007    Borkenhagen ...... G06F 11/1666
                                                           365/200
(Continued)

FOREIGN PATENT DOCUMENTS

WO    2007028109 A2    3/2007

OTHER PUBLICATIONS

Meaney, et al., IBM zEnterprise Redundant Array of Independent Memory Subsystem, IBM J. Res. & Dev. vol. 56 No. 1/2 Paper Jan./Mar. 4, 2012, 11 pages.

(Continued)

*Primary Examiner* — Tan T. Nguyen
(74) *Attorney, Agent, or Firm* — Compass IP Law PC

(57) ABSTRACT

A stacked memory chip device is described. The stacked memory chip device includes a plurality of stacked memory chips. The stacked memory chip device includes read/write logic circuitry to service read/write requests for cache lines kept within the plurality of stacked memory chips. The stacked memory chip device includes data protection circuitry to store information to protect substantive data of cache lines in the plurality of stacked memory chips, where, the information is kept in more than one of the plurality of stacked memory chips, and where, any subset of the information that protects respective substantive information of a particular one of the cache lines is not stored in a same memory chip with the respective substantive information.

20 Claims, 14 Drawing Sheets

(51) Int. Cl.
   *G06F 11/10* (2006.01)
   *G11C 5/04* (2006.01)
   *G11C 7/10* (2006.01)
   *G11C 29/42* (2006.01)
   *G11C 29/52* (2006.01)
   *G11C 29/00* (2006.01)
   *G11C 7/24* (2006.01)
   *H01L 25/065* (2006.01)
   *G11C 29/04* (2006.01)

(52) U.S. Cl.
   CPC .............. *G11C 2029/0411* (2013.01); *H01L 2225/06541* (2013.01)

(56) References Cited

U.S. PATENT DOCUMENTS

| | | | |
|---|---|---|---|
| 7,330,992 B2 | 2/2008 | Jeddeloh et al. | |
| 7,363,442 B2 | 4/2008 | Barnum et al. | |
| 7,401,193 B1* | 7/2008 | Ye | G06F 11/2087 711/162 |
| 7,805,586 B2 | 9/2010 | Ryan | |
| 7,814,273 B2* | 10/2010 | Barrall | G06F 3/0607 711/114 |
| 7,917,831 B2 | 3/2011 | Millman et al. | |
| 8,484,529 B2 | 7/2013 | Alves et al. | |
| 8,522,122 B2 | 8/2013 | Alves et al. | |
| 8,549,378 B2 | 10/2013 | Alves et al. | |
| 8,806,285 B2* | 8/2014 | Alameldeen | G06F 11/1048 365/200 |
| 8,843,806 B2 | 9/2014 | Meaney et al. | |
| 2003/0142595 A1* | 7/2003 | Morrison | G11B 7/0065 369/30.21 |
| 2004/0090827 A1* | 5/2004 | Dahlen | G06F 11/2061 365/200 |
| 2007/0204201 A1 | 8/2007 | Gower et al. | |
| 2011/0041037 A1 | 2/2011 | Frost et al. | |
| 2011/0167319 A1 | 7/2011 | Jeddeloh | |
| 2014/0059301 A1 | 2/2014 | Rao | |
| 2014/0245105 A1 | 8/2014 | Chung et al. | |
| 2014/0304469 A1* | 10/2014 | Wu | G06F 3/065 711/114 |
| 2014/0376320 A1* | 12/2014 | Loh | G11C 29/76 365/200 |
| 2015/0143024 A1 | 5/2015 | Luo et al. | |
| 2015/0143027 A1 | 5/2015 | Luo et al. | |
| 2015/0243373 A1 | 8/2015 | Chun et al. | |
| 2015/0339187 A1 | 11/2015 | Sharon et al. | |
| 2017/0046221 A1 | 2/2017 | Bandic et al. | |
| 2017/0242754 A1 | 8/2017 | Jang et al. | |
| 2017/0277432 A1* | 9/2017 | Yun | G06F 3/0679 |
| 2018/0374548 A1* | 12/2018 | Achtenberg | G11O 16/3418 |

OTHER PUBLICATIONS

U.S. Appl. No. 62/422,576, Filed Nov. 15, 2016, 39 pages.
First Office Action for U.S. Appl. No. 15/814,336, dated Mar. 22, 2019, 14 pages.
Extended European Search Report for Patent Application No. 18175275.9, dated Nov. 7, 2018, 10 pages.
Udipi, et al., "Rethinking DRAM Design and Organization for Energy-Constrained Multi-Cores", ISCA'10, Jun. 19-23, 2010, Saint-Malo, France, pp. 175-186.
Final Office Action for U.S. Appl. No. 15/814,336, dated Jul. 12, 2019, 15 pages.

* cited by examiner

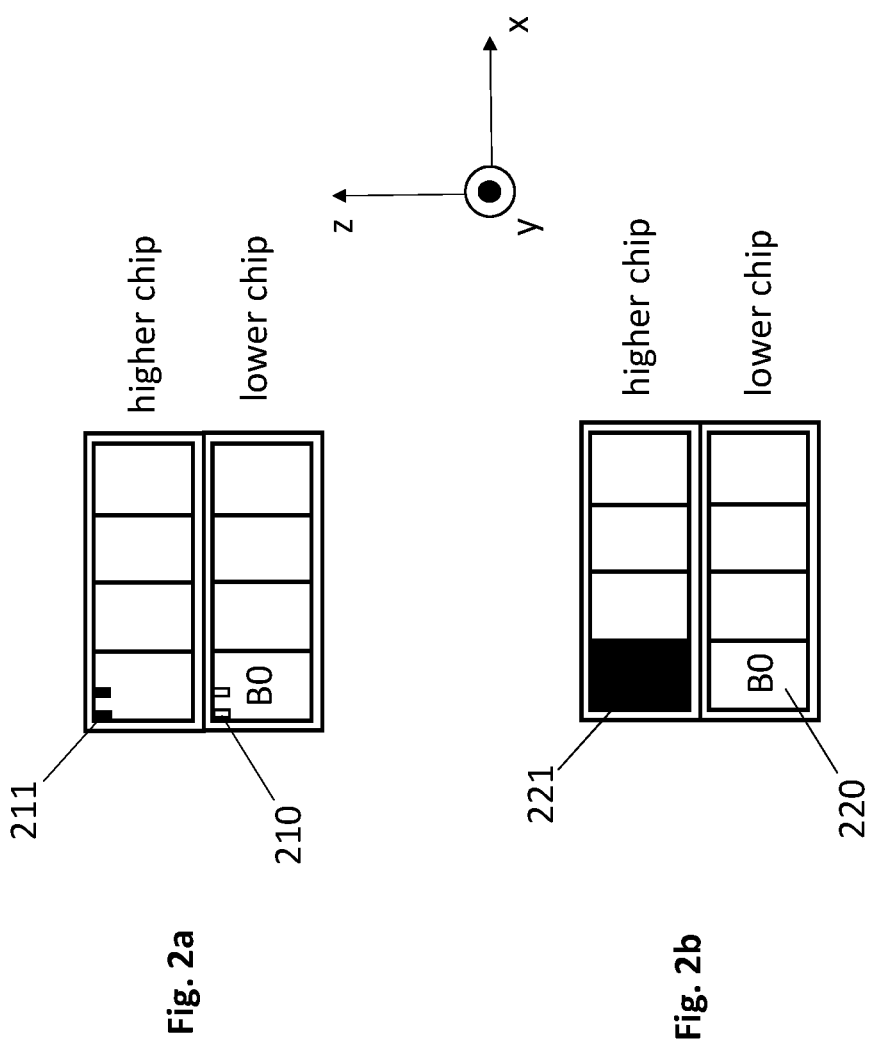

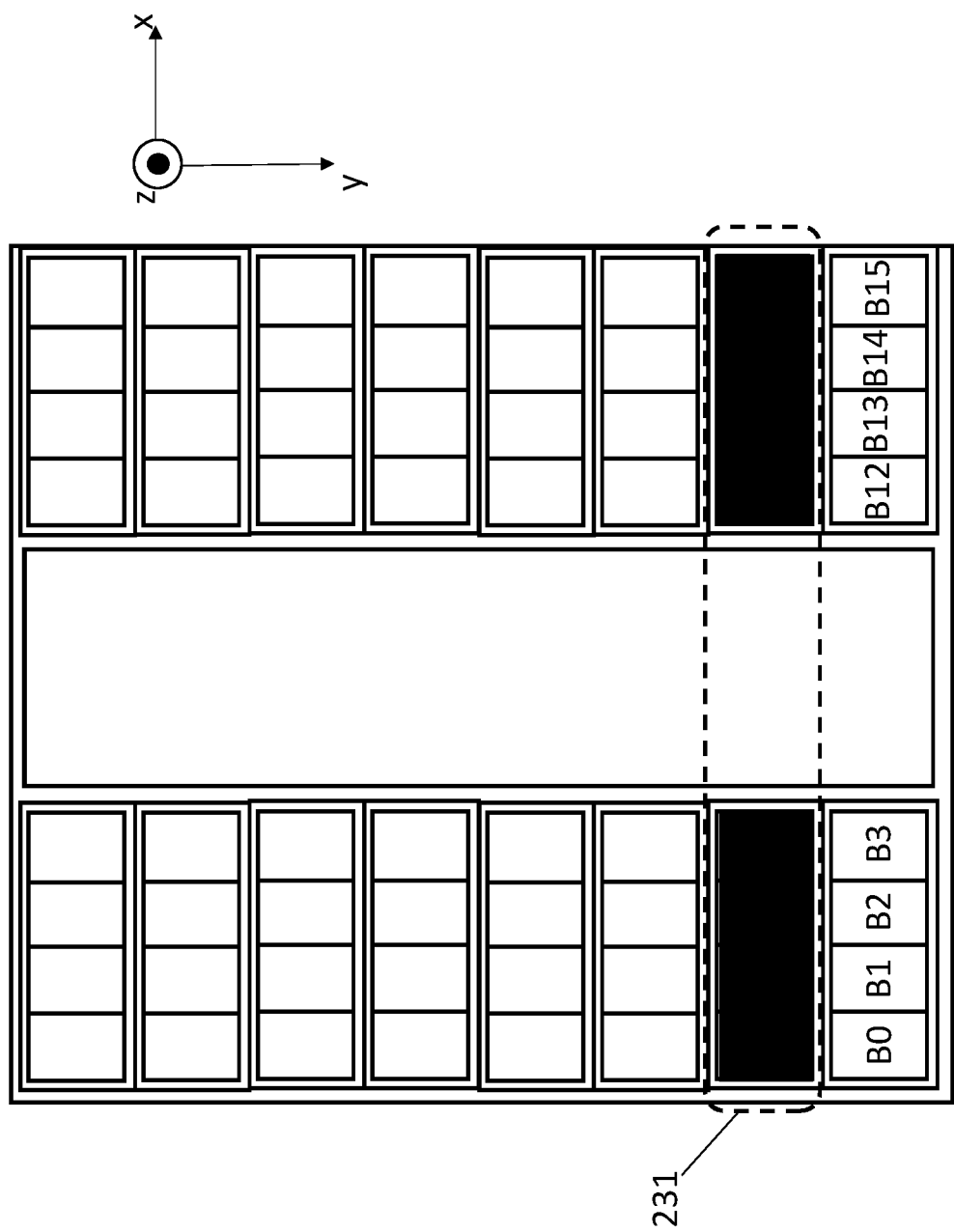

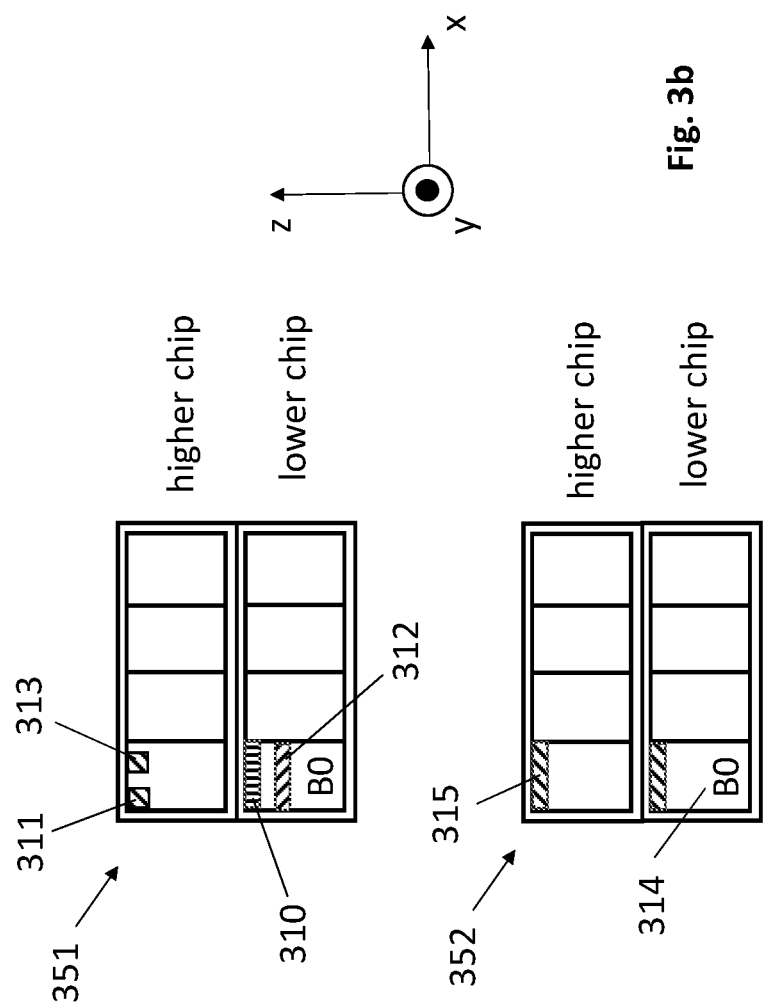

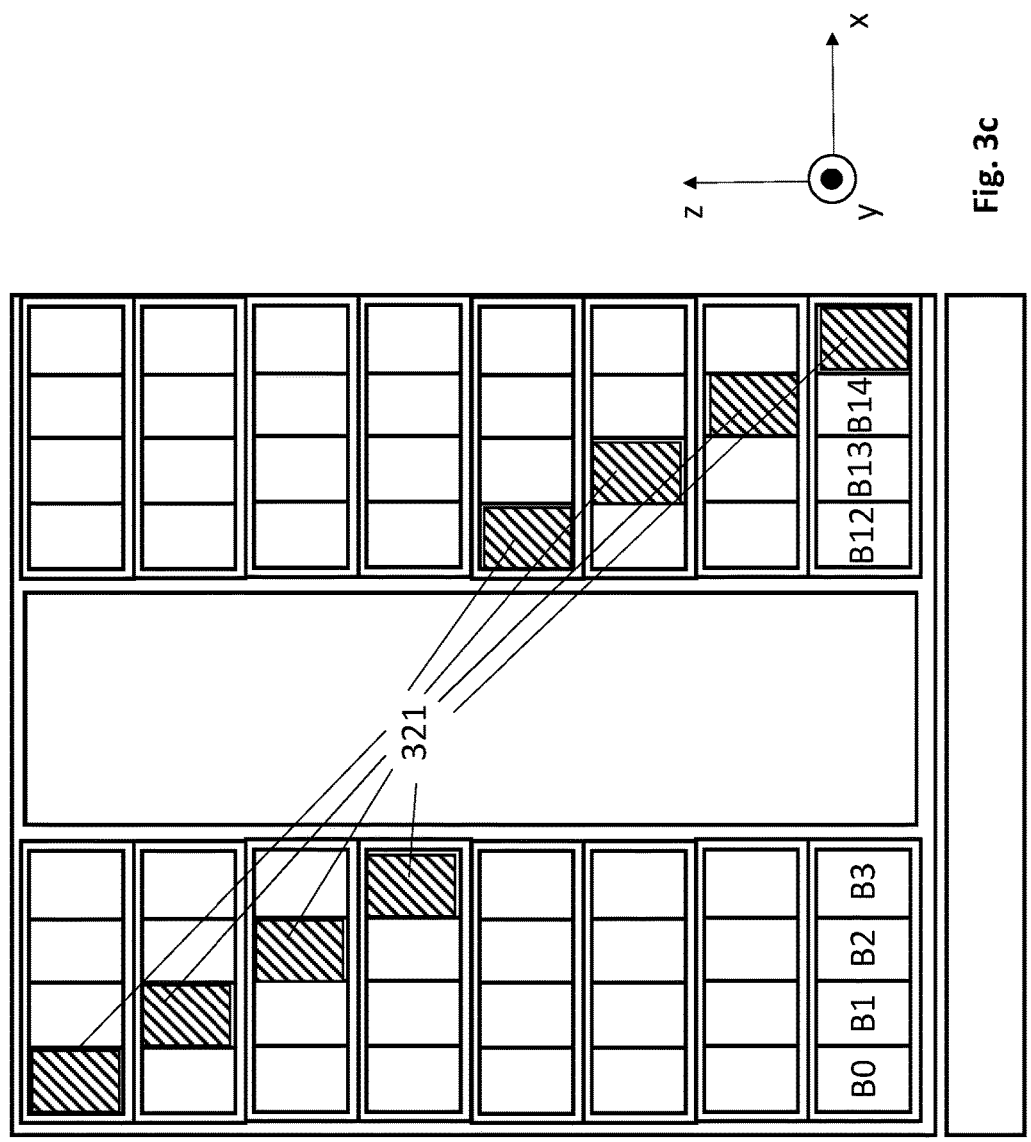

STACKED MEMORY CHIP DEVICE WITH ENHANCED DATA PROTECTION CAPABILITY

FIELD OF INVENTION

The field of invention pertains generally to the computing sciences, and, more specifically, to a stacked memory chip device with enhanced data protection circuitry.

BACKGROUND

Non-volatile mass storage systems have traditionally used various forms of protection to preserve the data being stored. Examples include various redundant arrays of inexpensive disk drive (RAID) protection schemes such as RAID1 (mirroring data stored in a first disk drive on another disk drive); RAID4 (disk drives and/or sectors thereof are reserved for the storage of error correction coding (ECC) information that is used to protect substantive data stored on other disk drives and/or sectors thereof); RAID5 (distribution of ECC information across multiple disk drives and/or sectors thereof); RAID6 (substantive data maps to more than one instance of ECC information).

Current system memory (also referred to as main memory) developments are stacking memory chips into a single package to, e.g., increase the memory storage cell density per unit of volume within a computing system. Such system memory implementations can also benefit from data protection schemes.

FIGURES

A better understanding of the present invention can be obtained from the following detailed description in conjunction with the following drawings, in which:

FIGS. 1a and 1b show a stacked memory chip device;

FIGS. 2a, 2b, 2c and 2d pertain to implementing mirroring in a stacked memory chip device;

FIGS. 3a, 3b, 3c, 3d, 3e and 3f pertain to implementing ECC protection in a stacked memory chip device;

DETAILED DESCRIPTION

Figure 1A:
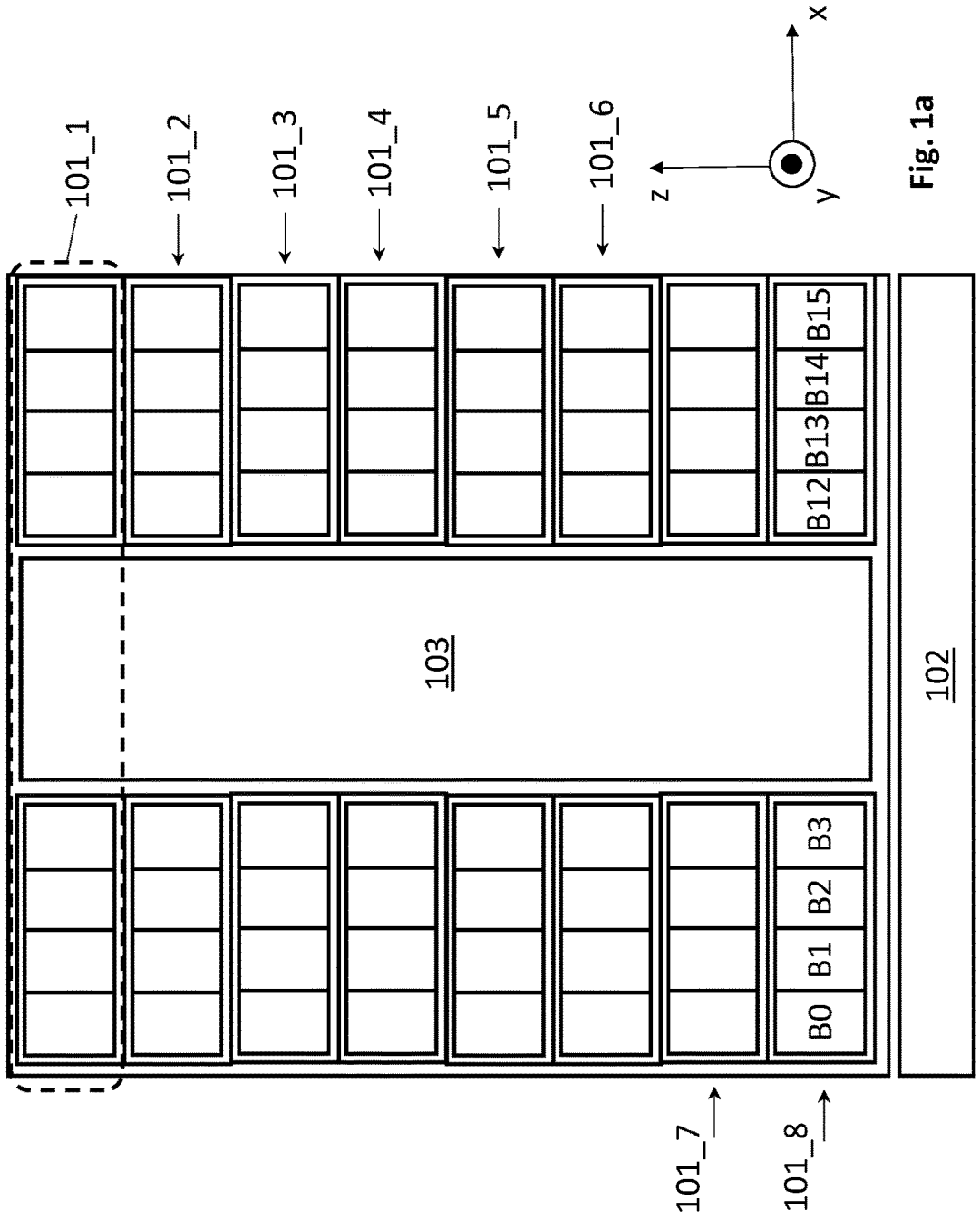
Figure 1B:
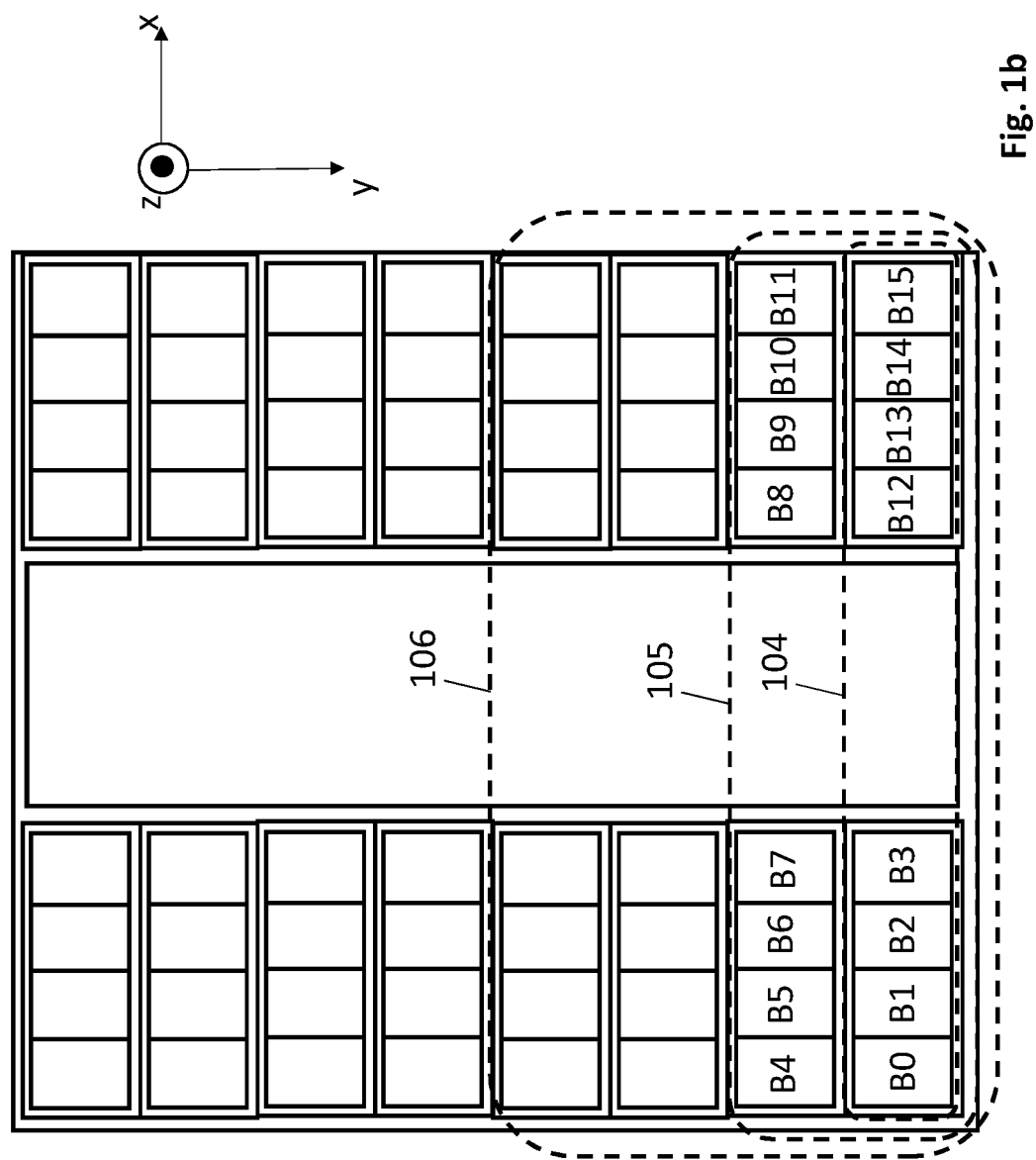

FIGS. 1a and 1b depict a cross section and a top down view, respectively, of a memory device composed of stacked memory chips (e.g., volatile (for example, Dynamic Random Access Memory) or non-volatile (for example, NAND)). Referring to FIG. 1a, the memory device includes eight stacked memory chips 101_1 through 101_8 and a lower semiconductor chip 102 that provides supporting logic and interface circuitry for the eight memory chips (for illustrative ease the physical border of only the topmost chip 101_1 is outlined in FIG. 1a). Signals sent to/from any of the memory chips 101 and the lower semiconductor chip 102 or a substrate beneath the lower semiconductor chip (e.g., a PC board) are routed through internal vertical conducting wiring (such as through silicon vias (TSVs)) that run through the central part of the memory chips 103.

As is known in the art, TSVs are vertical signal wire structures (e.g., vias or plugs) that extend vertically from a top surface of a chip to a bottom surface of a chip. Vertical wiring that electrically couples stacked chips can therefore be effected by stacking chips on one another such that their respective TSVs are aligned. As such, for instance, the wiring of an address bus and/or a data bus can run vertically through the aligned TSVs of the stacked memory chips to each memory chip or any particular memory chip or subset of memory chips depending on overall device design.

Referring to FIG. 1b, which shows a top down view of one of the memory chips, sixteen different memory cell banks are labeled as banks B0 through B15. In the case of a planar memory device such as DRAM where memory cells are formed in the top surface of the chip's semiconductor substrate, each bank corresponds to a surface area that includes a two-dimensional array of memory cells. Here, the entire memory chip can be viewed as including a first plurality of rows and a second plurality of columns, where, one or more memory cells are located at each unique intersection of particular row and a particular column. In various embodiments, a memory bank is understood to be the total memory space associated with a specific subset of the rows and a specific subset of the columns.

A specific portion of the storage space of a single memory chip can therefore be categorized according to various degrees of granularity. A finest degree is the memory space associated with the intersection of a particular row and a particular column. A next higher degree is the memory space associated with an entire bank (e.g., the memory space associated with bank B1). A next higher granularity is a bank group (e.g., banks B0 through B4 in FIG. 1b).

A next higher degree is the storage space associated with a rank. As can be seen in FIG. 1b, in various embodiments, a rank can be viewed as a row or column of banks 104 across a memory chip's memory array. A next higher degree is a pseudo-channel which includes more than one (e.g., two neighboring) rows or columns of memory banks 105. A next higher degree is a channel which is composed of a plurality, e.g., two, pseudo-channels 106. In reference to FIG. 1b, therefore, a specific portion of memory space can be defined by referring to such space by its row/column, bank, bank group, rank, pseudo-channel or channel.

With respect to the stacked memory device of FIGS. 1a and 1b, portions of the device's memory space can be granularized upward to even higher levels of abstraction such as recognizing the memory space of an entire memory chip (which includes the memory space of all of its channels) and the memory space of the entire device (the combined memory space of all its stacked memory chips).

Errors can be a problem with memory devices. Here, as the essence of dense memory devices is the fabrication of extremely small storage cells, such cells tend to be more prone to failures the smaller they become. As such, it is not uncommon for the various cells within a memory chip to exhibit errors during the memory chip's lifetime.

As is known in the art, system memory (also referred to as main memory) stores units of data in the form of cache lines. A cache line is a data structure composed of, typically, at least tens of bytes (e.g., 64 bytes, 128 bytes, etc.). Here, the local (CPU level) caches of one or more processing cores/CPUs are typically designed to store cache lines of information. If a core/CPU does not use a cache line that is within one of its caches often enough, the cache line is evicted from the cache and written back to system memory. Likewise, if a CPU needs data that is not contained by any of the cache lines that are currently in one of its local caches, a cache line containing the needed data is read from system memory and entered into a local cache. Thus, because the CPU's local caches are designed to keep data in units of cache lines, a cache line is typically the fundamental data structure that is written to and read from system memory.

Traditional system memory implementations, such as dual in-line memory module (DIMM) cards that each contain multiple DRAM chips and are plugged into a system motherboard, physical "split" a cache line into different pieces that are stored in separate DRAM chips. The splitting of the cache line and keeping it in different DRAM chips helps avoid complete loss of the cache line's data. Here, according to the operation of such traditional system memory implementations, the cache line is composed not only of its substantive data but also an error correction code (ECC) that is appended to the data. The error correction code is calculated from the substantive data and is therefore unique to the cache line's specific data. The ECC code and the substantive data are stored across the DRAM devices as a complete cache line.

Should some portion of the substantive data or ECC code become lost (e.g., because of internal DRAM error), the lost data can be retrieved by processing the remaining good data and ECC code. The above error correction process will be successful, however, only if the amount of corrupted data remains beneath some threshold (if too much data is lost the lost information cannot be recovered). The splitting of the cache line into different pieces and storing the different pieces into different respective DRAM chips helps to avoid a situation where too much cache line data is lost such that the lost information cannot be recovered.

Here, to the extent DRAM memory devices commit errors, the causes of the errors tend to be manufacturing related or otherwise characteristic of the chip itself. That is, if errors are to occur, it is most likely that errors happened because the data was stored in a "bad chip". However, because the cache line was split into multiple pieces and stored amongst multiple chips, only a smaller piece of the cache line is at most lost (the other pieces in the other "good" chips are not corrupted) which enables the recovery of the lost data. That is, splitting the cache line into multiple pieces typically limits the corruption to only piece which is less than the threshold beyond which recovery is not possible.

A problem with at least some present stacked DRAM devices (such as devices that conform to High Bandwidth Memory 2 (HBM2), a Joint Electron Device Engineering Council (JEDEC) supported industry standard, and High Bandwidth Memory 3 (HBM3)), however, is that no such splitting of cache lines takes place. Rather, an entire cache line is typically stored in a single memory chip. Here, for instance, referring to FIG. 1a, a cache line is sent to the lower semiconductor chip 102 from a host system (e.g., a main memory controller). The lower semiconductor chip 102 then writes the entire cache line into a channel of one of the device's particular memory chips. Should the memory chip be a "bad chip", it is conceivable that the entire cache line could be lost because, potentially, the amount of lost data may exceed the critical threshold beyond which lost data cannot be recovered.

As such the following discussion pertains to various mechanisms for storing data within a stacked memory chip device with better error recovery protection. FIGS. 2a, 2b, 2c and 2d show a first approach that uses mirroring. Here, mirroring is different than error correction coding. Mirroring is a sheer redundancy approach in which same data is stored in multiple, different locations. In the case of a stacked DRAM device, according to various embodiments, the different locations correspond to different memory chips within the memory chip stack. Moreover, the granularity at which mirrors of data are stored can vary from embodiment to embodiment in accordance with the different granularities discussed above with respect to FIGS. 1a and 1b.

FIG. 2a shows a first mirroring embodiment in which a subset of cache line data that is stored at a particular row and column combination within a first memory chip is also stored at another row and column combination in another memory chip. In the particular embodiment of FIG. 2a, the mirror (duplicate) data 211 is stored at the same location (same specific row and column combination) of the semiconductor chip that sits directly above the chip that holds the primary data 210. It is pertinent to recognize that this is just one approach and, conceivably, the duplicate data item could conceivably be stored anywhere else in the overall device according to any of a large number of different placement algorithms provided the duplicate data 211 is not stored on the same chip as the primary data 210.

FIG. 2b shows another embodiment where the duplicate data 221 is stored at the granularity of a bank rather than a specific row/column combination. Here, again, the duplicate block 221 corresponds to the same bank as the primary data's bank 220 in the memory chip that sits directly above the memory chip where the primary data 220 is stored. Again, the duplicate bank 221 could be stored in a different chip and/or chip location according to a wide range of different possible placement/mapping algorithms.

Figure 2D:
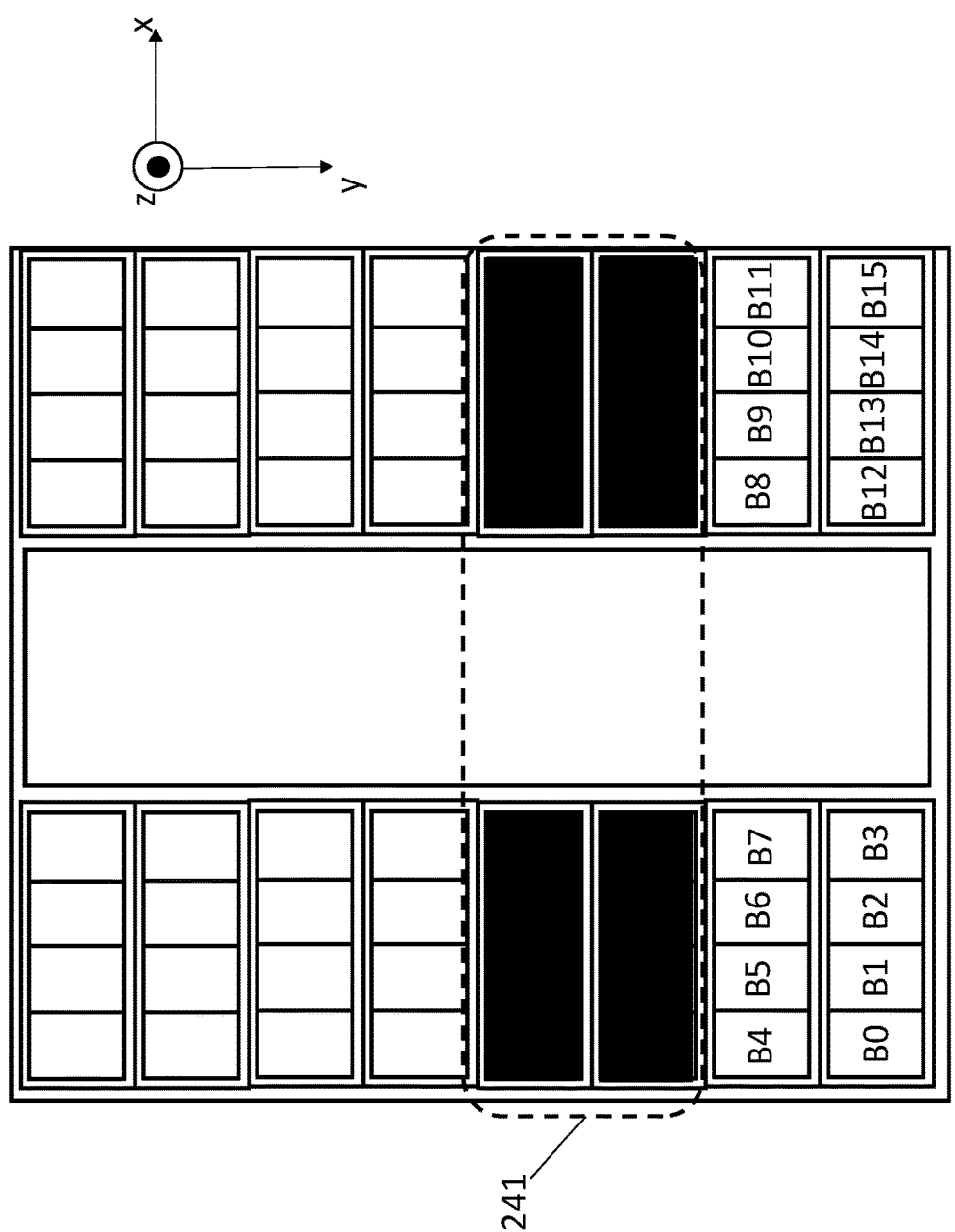

FIG. 2c shows that duplicate data 231 can be stored at the granularity of a pseudo-channel. Here, duplicate data 231 is observed consuming an entire pseudo-channel of a particular memory chip. FIG. 2d, by contrast, shows that duplicate data 241 can consume an entire channel of a particular memory chip. Unlike FIGS. 2a and 2b, which show cross-sectional views, FIGS. 2c and 2d show top down views. As such, according to various embodiments, the primary pseudo channel worth of data that the duplicate data 231 of FIG. 2c protects is not stored on the chip observed in FIG. 2c. Instead it is stored on some other memory chip in the stack of memory chips. Likewise, the primary channel worth of data that the duplicate data 241 of FIG. 2d protects is not stored on the chip observed in FIG. 2d. Instead it is stored on some other memory chip in the stack of memory chips. In still yet other embodiments, at even higher levels of granularity, entire memory chips in the stack of memory chips may be reserved for duplicate data (e.g., every other chip in the stack is reserved for duplicate data).

Note that, depending on the mirroring granularity and the size of the cache lines, in some cases multiple separate pieces of a duplicate cache line data are created in order to duplicate an entire cache line, whereas, in other cases, multiple cache lines worth of duplicate data may be stored in a same area reserved for duplicate data. For example, in the case of the row/column granularity level of FIG. 2a, if a byte of information is stored at each row/column combination and if a cache line corresponds to 64 bytes of information, 64 different instances of duplicate data (of which duplicate data instance 211 is just one), will be stored in the stacked memory chip device. Notably, these separate duplicate data instances need not be stored contiguously (next to one another) in the memory stack (e.g., different instances can be spread out across a same die or multiple die). Nevertheless, in various other embodiments they may be stored contiguously to, e.g., keep memory addressing overhead of duplicate data low.

By contrast, e.g., in the case where an entire pseudo-channel or channel is reserved for duplicate data as in the examples of FIGS. 2c and 2d, the respective duplicate cache line for each of multiple primary cache lines may be stored in a same reserved duplicate data area.

According to one implementation, where no error flags have been raised, the memory device services a cache line read request by providing the primary cache line (the duplicate cache line is left alone). However, in the case of a cache line write request, again when no error flags are raised, the memory device not only writes the new data over the primary cache line but also writes the new data over the duplicate cache line. As such, whatever mapping algorithm is used to determine the location of a duplicate cache line (including potentially its multiple different pieces) is effectively executed in response to a write request in order to understand which location(s) of the memory device are to be written to in order to write the duplicate cache line into the memory device.

FIGS. 3a through 3f pertain to different granularities at which ECC information can be stored within a stacked memory device. Here, recall from the discussion above, that ECC information is calculated from a cache line's substantive data and logically appended to the substantive data. Importantly, unlike mirroring which devotes 50% of the storage resources to protective information (in a 1:1 mirroring scheme), by contrast, the amount of ECC information that is sufficient to protect a cache line is typically a modest percentage of the size of the substantive data. As just one example, a complete cache line may be formed from eight different cache line segments, seven that are devoted to its substantive data and an eighth that is devoted to its ECC information. That is, the ratio of substantive data to ECC information of any particular cache line is 7:1. FIGS. 3a through 3e assume this same ratio for the sake of example but the reader should understand this specific ratio is only exemplary.

Figure 3A:
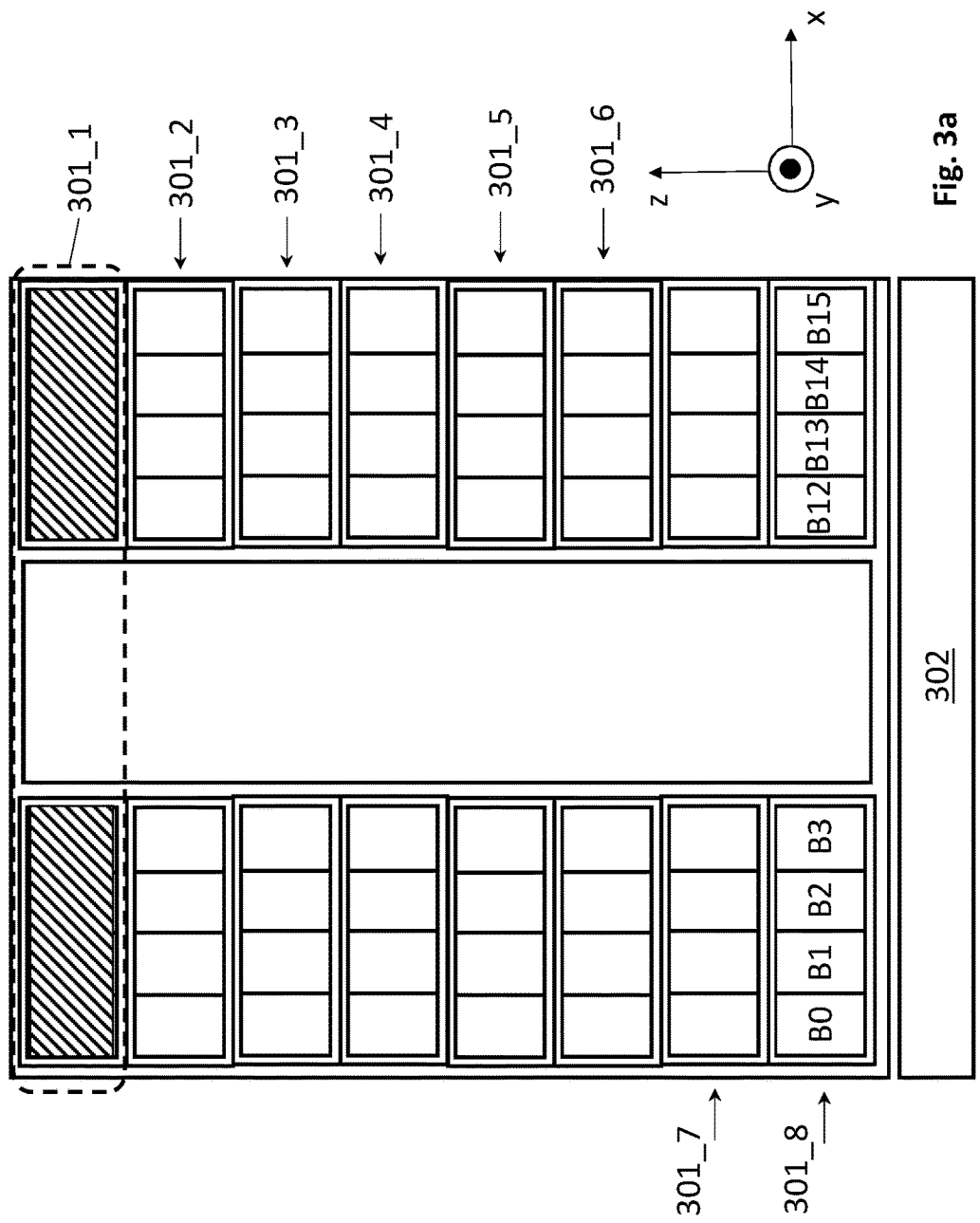

FIG. 3a shows a basic approach in which the ECC information for all the cache lines that are stored in the memory device are stored in a same chip 301_1 in the memory chip stack. That is, as observed in FIG. 3a, there are eight different memory chips 301_1 through 301_8 in the memory chip stack and the topmost chip 301_1 is where all ECC information is kept. As such, the substantive data for all the cache lines stored by the device is kept in the seven memory chips 301_2 through 301_8 beneath the ECC memory chip 301_1.

In the case of a cache line write operation, according to one embodiment, the cache line's ECC information is split from the cache line and stored in the topmost chip 301_1 while the remaining substantive data of the cache line is stored somewhere within and/or amongst the seven lower memory chips 301_2 through 301_8. Here, the substantive data may also be spliced and stored in different memory chips. For example, the write process may include splicing the cache line into eight different pieces including the ECC information and storing each piece in a different one of the memory chips (with the ECC information piece being stored in the top chip 101_1). The lower logic chip 302 may therefore include circuitry to perform such splicing (e.g., routing circuitry that routes different data bus segments to different memory chips). A read operation is the reverse of the write operation. For example, using the immediately prior example, all eight pieces of a cache line are read from their respective memory chip, assembled into a complete cache line, and forwarded to the requestor.

Note that in a number of implementations the memory device need not determine the ECC information that is appended to the substantive data. Rather, e.g., a host side memory controller may determine the ECC information, append it to the substantive data and send the complete cache line composed of substantive data and ECC information to the memory device. The memory device, specifically, e.g., the lower logic chip 102, then divides the cache line into separate pieces and stores them as described above. In alternate embodiments the substantive data may be stored all on one chip.

In still yet other embodiments, e.g., in order to increase the storage density of the memory device, ECC information is calculated from multiple cache lines that are received by the memory device to be written into the memory device. For example, if the substantive data to ECC ratio is to change from 7:1 to 15:1, a single instance of ECC information may be calculated from the substantive data of a pair of cache lines. In this case, the lower logic chip 102 may contain queueing logic circuitry to queue cache lines so they can be grouped in pairs. Additionally, the lower logic chip 102 may contain ECC calculation logic circuitry to determine the ECC information for the pair of cache lines. Once the ECC information for a group of cache lines has been determined, the group of cache lines and their ECC information are stored in the memory chips of the memory device with the ECC information being stored in an ECC reserved area of the top chip 101_1 (only half of which need be reserved for ECC information in this example).

In the case of a read request for any one of the cache lines of a cache line group, all cache lines in the group are read along with their ECC information to ensure that the data is not corrupted. As such, the lower logic chip 102 may also contain error checking and correction circuitry to process the cache lines with their ECC data and correct any errors that may arise before forwarding the requested cache line to the requester (e.g., a host side main memory controller). In the case of a write operation, all cache lines in the group except the cache line being updated with new data are read from the memory chip(s) and their substantive data along with the new updated cache line's substantive data are used to calculate a new ECC value for that group that is stored along with the new updated data of the cache line that is written to.

FIG. 3b shows ECC information that is determined at the granularity of a specific row/column combination. Here, referring to inset 351, ECC information 311 is determined for an amount of substantive data from a group of specific row/column combinations 310, where, e.g., the ratio between the amount of substantive data in the group 310 and the ECC information 311 conforms to the ratio of the ECC protection scheme (e.g., 7:1). A second set of ECC information 313 that protects another group of row/column combinations 312 is also depicted in FIG. 3b. In this case, there may be multiple instances/pieces of ECC information per cache line (of which instance 311 is just one piece) that can be separately stored within the memory device. Such different pieces of ECC information need not be stored in a same memory chip so long as, according to one embodiment, they are stored in different memory chips than where the cache line's substantive data is stored. For example, according to just one possible approach all of the cache line's substantive data is stored in a same memory chip but the multiple corresponding pieces of ECC information are stored across the seven other memory chips.

In implementations where the ECC information is as extremely fine grained as observed in FIG. 3b, the memory device may determine the ECC information from the cache line's substantive data. In this case, e.g., a host side memory controller may not calculate ECC information and instead sends just the substantive data to the memory device. Alternatively the memory controller sends substantive data and ECC information and the memory device views both as substantive data that it is to calculate new (lower level) ECC information from.

The memory device then calculates the multiple different pieces of the fine grained ECC information from fined grained pieces of the substantive data and stores the pieces of substantive data and the pieces of ECC information in the memory devices according to some mapping algorithm for both substantive data and ECC information (again where ECC pieces are not stored in same chips as substantive pieces). In various embodiments, a single piece of ECC information may be as small as a byte level data structure. For example, ECC information may be calculated for every seven bytes of substantive data. Referring to FIG. 3b, e.g., the seven bytes of substantive data correspond to data group 310 and the ECC information corresponds to piece 311.

Inset 352 of FIG. 3b shows a particular embodiment where ECC information is calculated for specific row/column combinations. In inset 352, assume each bank has eight different rows. Here, seven (lower) rows are reserved for substantive data and the eighth (top) row is reserved for ECC information. ECC information for the particular seven rows of a first memory chip are kept in the eighth row of another, second memory chip. For example, as depicted at inset 352, the ECC information 315 in the top row of the higher memory chip is for the substantive data 314 in the seven lower rows of the lower memory chip. In a further embodiment, a cache line's address is used to identify which memory chip its ECC data is to be stored in. For example, according to one embodiment, three bits of a cache line's address information is used to identify which one of the eight memory chips the cache line's ECC data is to be kept in.

In various embodiments of such fine grained ECC information, the ECC information can be calculated on the memory chip where it is to be stored or by the lower logic chip 302.

FIG. 3c shows another embodiment in which ECC information 321 is granularized at the bank level. Here, e.g., every seven banks of substantive data resolves to a single bank of ECC information. FIG. 3c shows banks that are reserved for ECC information being distributed not only across different memory chips but also across different bank locations amongst the memory chips. Additionally, with FIG. 3c being a cross sectional view, there is a depth of banks along the y axis. For each bank location along the y axis, another set of eight banks will be reserved for ECC information. The set may have the same pattern as depicted in FIG. 3b or exhibit a different pattern. In the case of the later, for example, each next bank location along the y axis moves the ECC bank location one bank unit location to the right. That is, ECC information stored within a same memory chip stores its ECC information in different x axis bank locations moving along the y axis.

As with other approaches described above, the substantive data for any cache line whose ECC information is kept in a particular bank should not be stored in the same semiconductor chip as that bank. Here, note that as the storage size of an ECC back may be quite large, the ECC information for more than one cache line may be kept in a single bank. Here, in various embodiments, each bank is viewed as having different sections (e.g., rows) where the ECC information for a single cache line is kept. Each particular section of an ECC bank then has a corresponding mapping of where its cache line's corresponding substantive information is kept. The mapping does not conflict with any other cache lines kept by the device (one an ECC bank section has been correlated to specific other location(s) where substantive data for that section's cache line is to be stored, those location(s) cannot be used to store substantive data for any other ECC bank section).

Figure 3D:
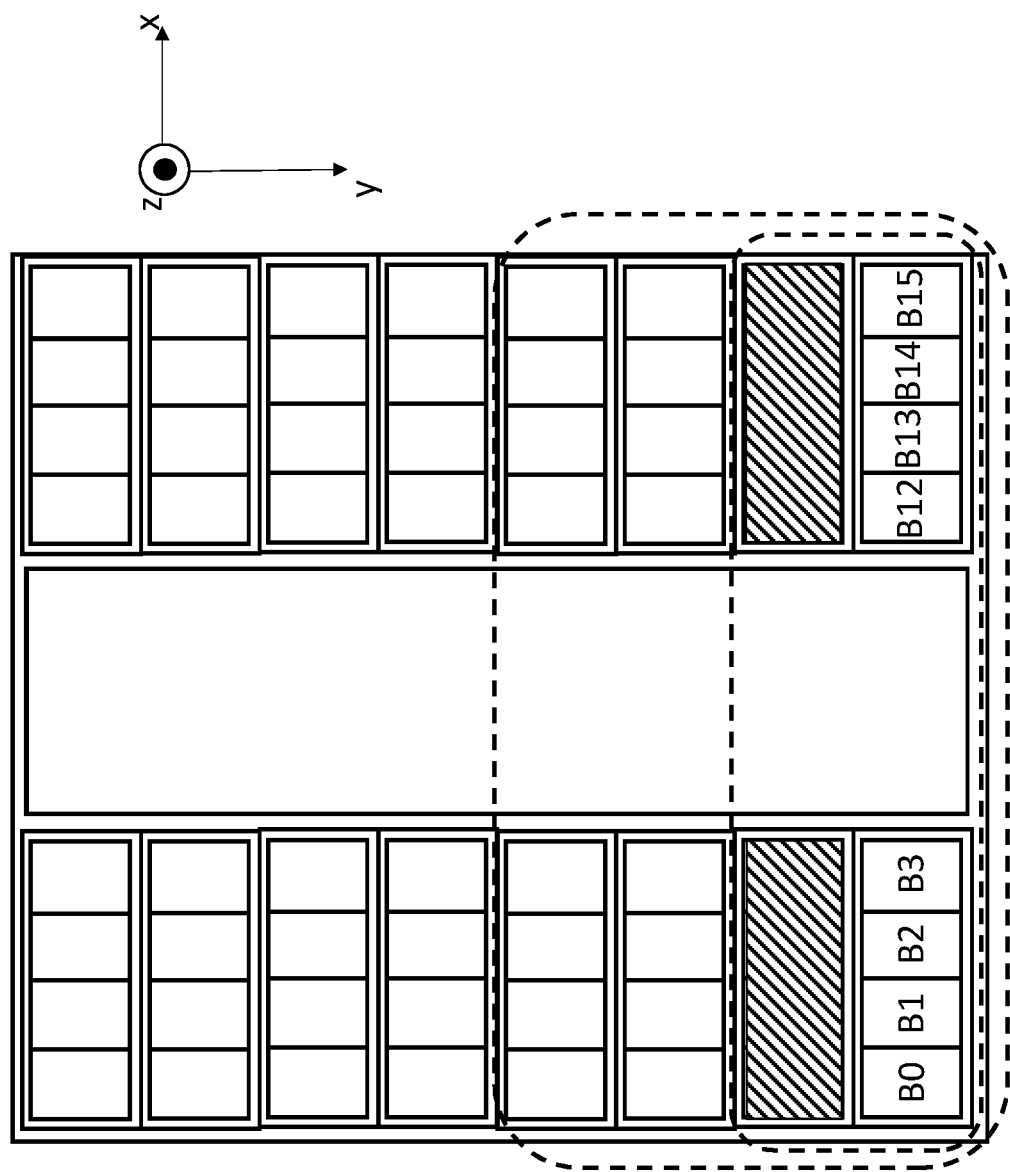
Figure 3E:
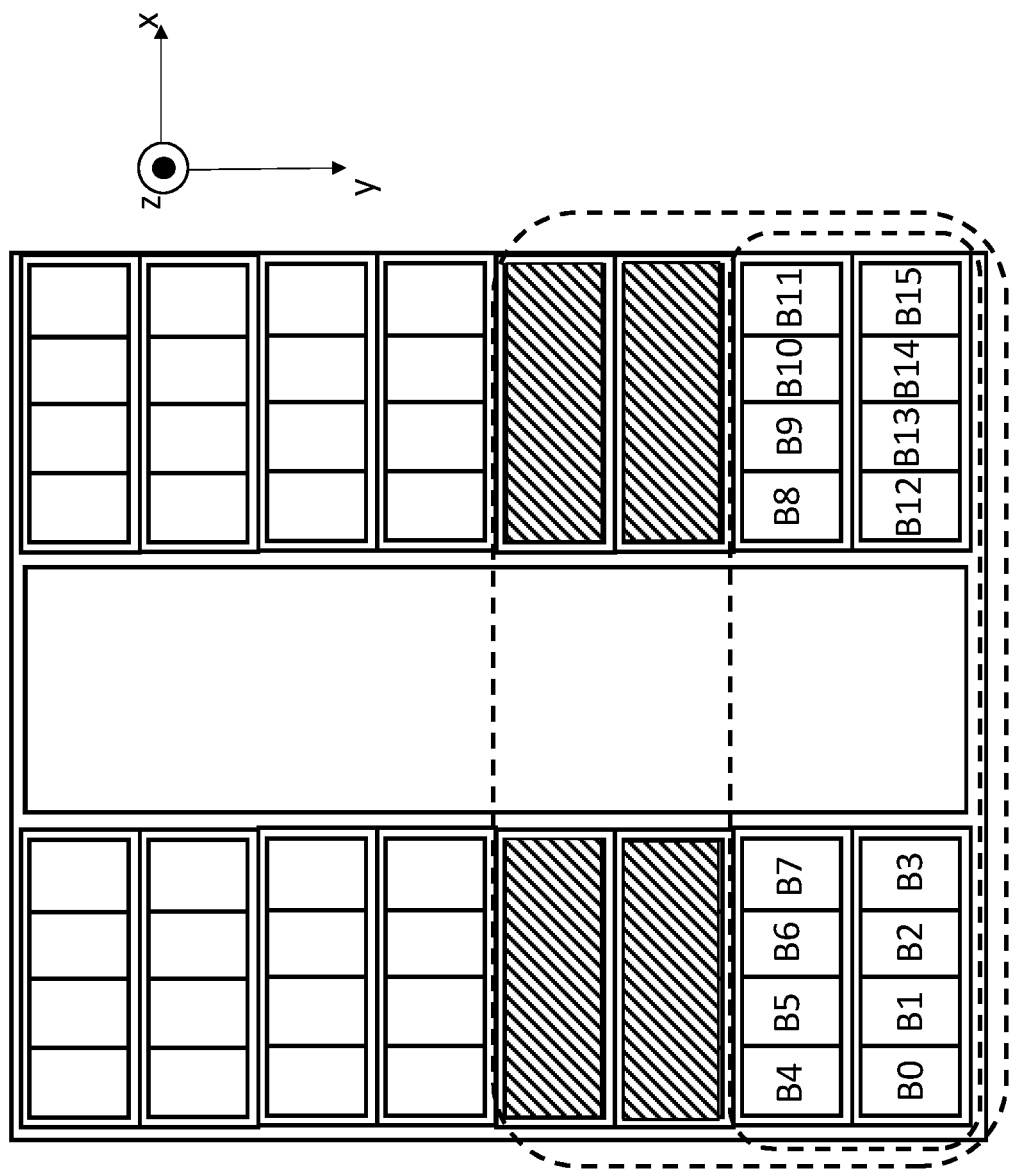
Figure 3F:
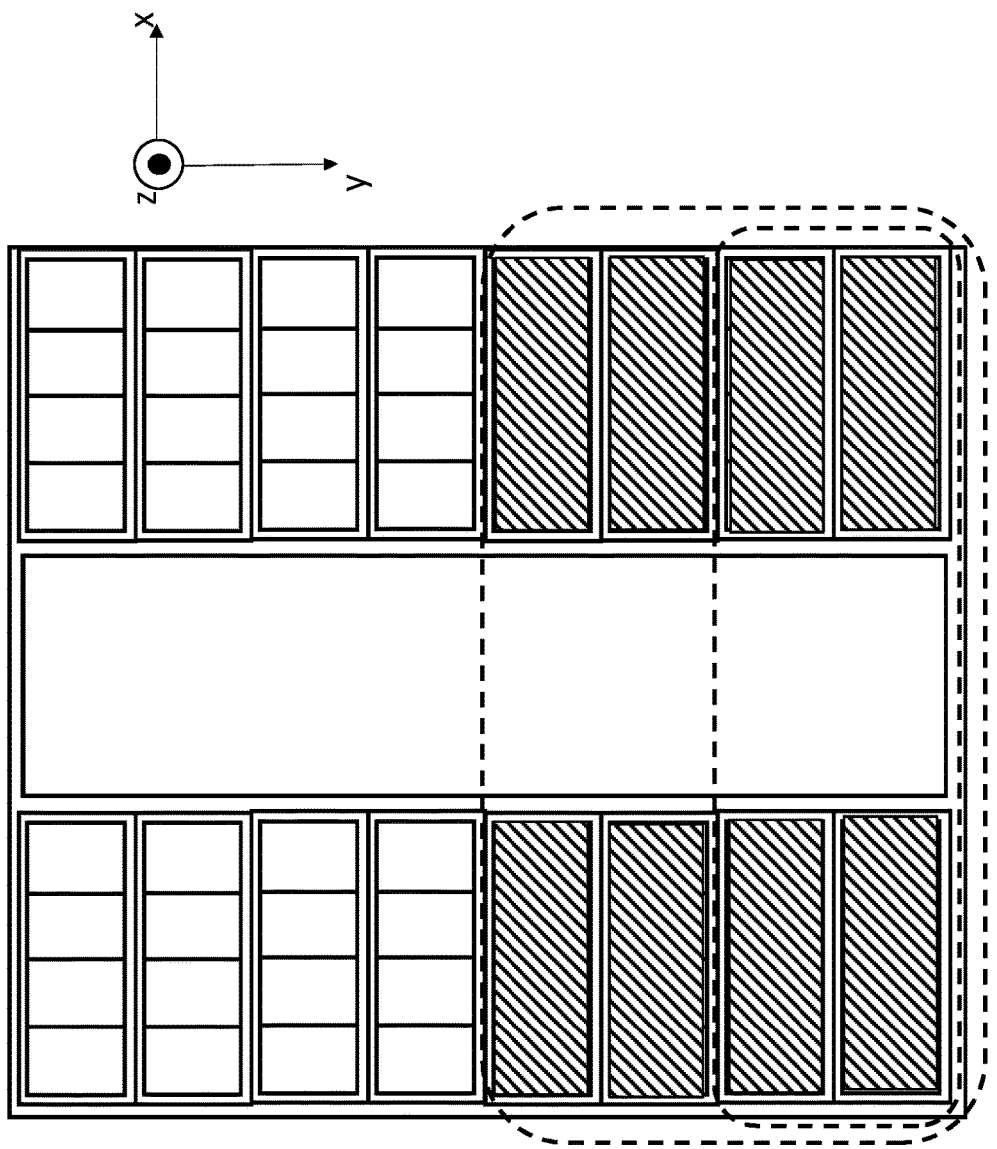

FIGS. 3d through 3f show larger grained areas that are reserved for the keeping of ECC information. Specifically, FIG. 3d shows that ECC information can be reserved at rank granularity, FIG. 3e shows that ECC information can be reserved at pseudo-channel granularity and FIG. 3f shows that ECC information can be reserved at channel granularity. Here, each of the points made immediately above with respect to bank level ECC granularity equally apply to the embodiments of FIGS. 3d, 3e and 3f.

In still yet other embodiments, the ECC information may be mirrored or a single cache line's substantive data maps to two different units of ECC information (e.g., where each unit is calculated according to a different encoding formula than the other unit). Ideally, each instance of ECC information and primary substantive data are stored on different memory chips in the memory chip stack.

In further embodiments, some percentage of the device's total memory space may be nominally unused for reserved for redundant copies of items in case of hard errors that result in certain units of storage being permanently restricted from future use. As such, consider an example where a piece of a cache line becomes corrupted but is later recovered successfully through the error correction process. If the region (e.g., row/column combination or bank) where the corrupted piece of cache line was stored is deemed unreliable for future use, the region is no longer used and the piece of cache line or the cache line's ECC information may be moved into the nominally unused region (e.g., the original bank is deemed "bad" and replaced by a bank in the nominally unused section of the memory device).

In still yet other embodiments, mirroring and ECC protection can be performed on any particular cache line according to, e.g., a combination of any of a number of the mirroring approaches discussed above and any of a number of the ECC protection schemes discussed above. For instance, mirroring information may be stored on a particular memory chip or a respective memory chip that is just above the memory chip where the substantive information that the mirroring information mirrors is stored. Additionally, ECC information for the substantive information may be stored on memory chip(s) other than the memory chip(s) where the substantive information is stored.

Although embodiments above were directed to the storage of mirroring and/or ECC information along with substantive data in a single stack of memory chips, various alternative approaches may embrace a multi-stack approach such as a two-stack approach were first substantive data is stored in a first stack of memory chips and mirroring and/or ECC information for the first substantive data is stored in another, second stack of memory chips. The mirroring and/or ECC information may be stored according to any of the schemes discussed at length above. As such schemes did not consume all the storage space in a stack, the second stack of memory chips may also store second substantive data whose corresponding mirroring and/or ECC information is stored in the first stack of memory chips.

Reads and writes would access both stacks for either the first or second substantive information. With respect to writes, substantive information would be written into one stack and the mirroring and/or ECC information would be written into the other stack. With respect to reads, in the case of mirroring information substantive data would be read from the stack where the substantive information is stored.

In the case of reads and ECC information, the substantive information would be read from one stack and the ECC information would be read from the other stack. The respective logic chips beneath the stacks would perform one or the other of substantive data access or ECC data access depending on which chip's stack contained which kind of data. But both chips would be designed to access substantive data and ECC information because their respective stacks store both kinds of information.

Also, referring back to FIG. 1b, recall that a channel may be composed of multiple sets of banks on the surface of a same die (e.g., two pseudo channels where each pseudo channel corresponds to two banks). In various embodiments a channel is similar to a multi-drop bus in that a storage cell that is part of a particular channel is accessed along the channel it is coupled to. Multiple channels exist in the single die exist to, e.g., limit channel wiring densities. For example, the top half of the banks would be access through a first upper channel and the lower half of the banks 106 would be accessed through a second lower channel.

Ideally, only one (or at least a minimum possible set) of channels are activated to access any particular cache line. Thus, for instance, in the memory chip of FIG. 1b, cache line data is stored across a same bank row of the same memory chip so that only a single (e.g., lower 106) channel is activated to access the cache line. In the preceding discussions, however, the point was made that a cache line's mirroring or ECC information should be stored in separate one or more memory chips than where the cache line's substantive data is stored. As such, in various stacked solutions, a vertical channel is implemented such that the storage cells from more than one memory chip are coupled to a same channel. Here, as just one example, substantive and ECC information for a cache line may be stored in every other memory chip in the stack. As such, the channels are designed to couple the banks of every other chip were a same cache line's different pieces are stored so that only the single channel needs to be activated to access all of the cache line's different pieces.

Figure 4:
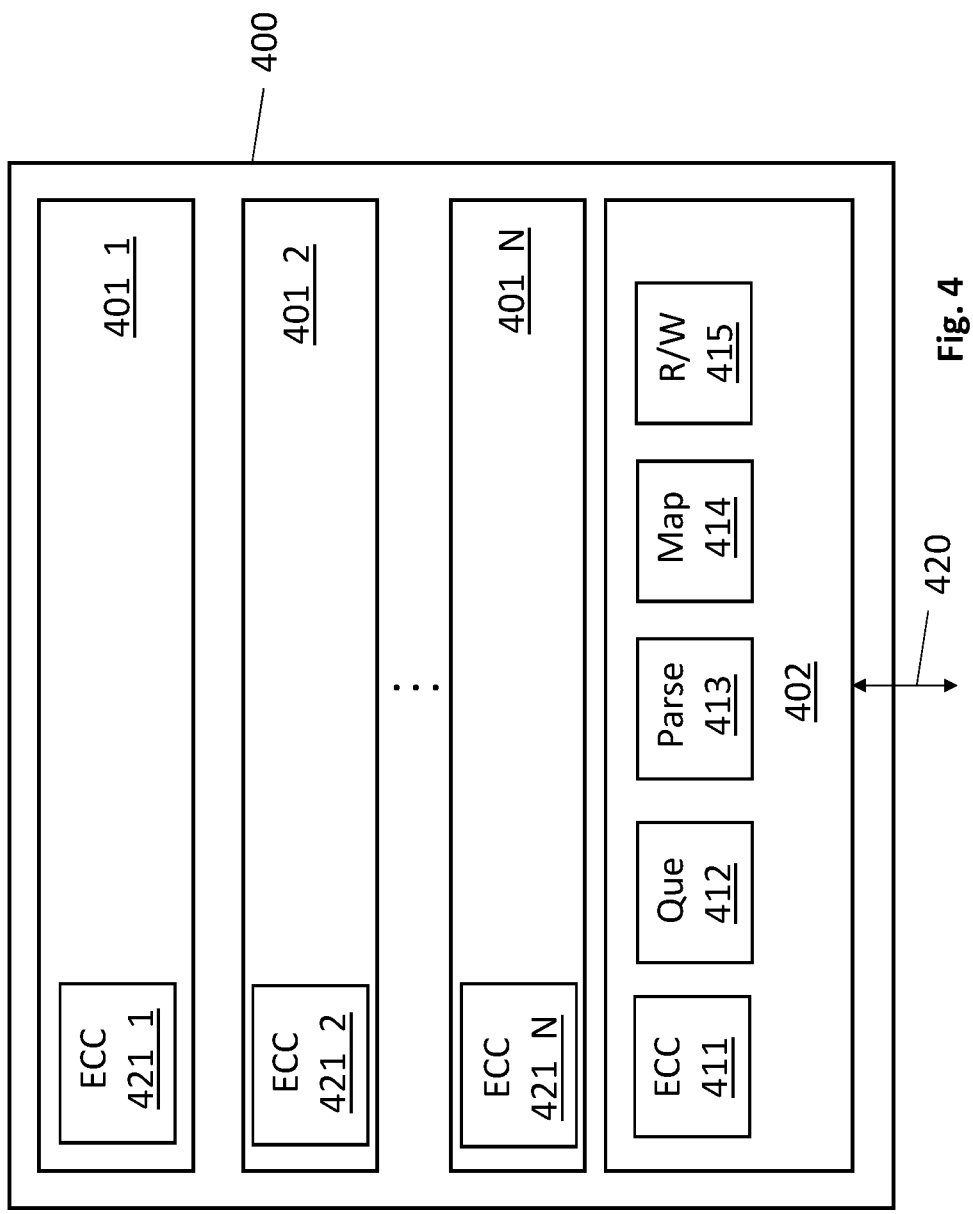
FIG. 4 shows a logical representation of a stacked memory chip device.

FIG. 4 shows a logical representation of a stacked memory chip device 400 that incorporates mirroring and/or ECC information according to any of the schemes described above.

As observed in FIG. 4, the memory device 400 includes a lower logic chip 402 that may include any of: 1) ECC logic circuitry 411 to determine ECC information to be written into one or more of the stacked memory chips 401_1 through 401_N and/or perform error checking and correction during read processes; 2) queueing circuitry to queue multiple cache lines for implementations where ECC information is determined by ECC circuitry 411 for groups of cache lines; 3) parsing circuitry 413 to parse a received write cache line and/or ECC information into separate pieces that are stored, e.g., in different locations such as on different memory chips, e.g., in accordance with a mapping algorithm (combining circuitry may also be present to combine such different pieces into a coherent cache line during read processes); 4) mapping circuitry 414 to map different cache lines, pieces of cache lines, ECC information, pieces of ECC information, mirroring data and/or pieces of mirroring data to their correct storage locations amongst the different memory chips 401 (the mapping circuitry is used to direct items to their correct location during a write and read the various items from their particular locations during a read); 5) read/write circuitry 415 to write different items to their correct locations in view of the mapping circuitry's input and read different items from their correct locations in view of the mapping circuitry's input and/or the particular ECC scheme that is place (e.g., read multiple cache lines in the case where a single ECC instance is determined from more than one cache line). The memory chips 401_1 through 401_N may also contain their own respective ECC circuitry 421 to determine ECC information to be written into its own memory chip and/or perform error checking and correction during read processes from its own memory chip. Note that any of circuits 411, 412, 413, 414, 415 and 421 may each be viewed as different components of larger data protection circuitry that exists within the memory device 400 as they each contribute in some way to the protection of substantive data as described herein.

Any of the logic circuitry described above may be implemented by dedicated logic circuitry (e.g., hardwired application specific integrated circuit (ASIC) logic circuitry or programmable logic circuitry such as field programmable gate array (FPGA) logic circuitry, programmable logic device (PLD) logic circuitry, programmable logic array (PLA) logic circuitry, etc.) or logic circuitry that executes some form of program code (e.g., an embedded controller or embedded processor that executes, e.g., low level firmware or device driver program code) or some combination thereof.

The memory device 400 may be complicit with various industry specifications such as HBM2 or HBM3. The memory device 400 also has an interface 420 which may be, e.g., an industry standard system memory interface (e.g., a DDR interface having specifications published by JEDEC) or other volatile memory interface. In particular embodiments, a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedc.org). Such standards (and similar standards) may be referred to as DDR-based standards and communication interfaces of the storage devices that implement such standards may be referred to as DDR-based interfaces.

Although the discussions above have been directed to stacked DRAM memory chips for system memory purposes other purposes or technologies are possible. For instance, the memory chips may instead be implemented with non-volatile memory chips such as FLASH memory chips, where, e.g., the units of stored data are larger than a cache line (e.g., blocks, sectors or pages of information). In such implementations the device 400 may be a mass storage device rather than a system memory device. As such, rather than a system memory interface, interface 420 may be a peripheral or storage interface such as, to name a few, Peripheral Component Interconnect Express (PCIe) link, SAS (Serial Attached SCSI (Small Computer System Interface) controller, Serial ATA (SATA) controller, Fibre Channel, etc.

In still yet other implementations the memory chips are non-volatile memory chips but are composed of an emerging non-volatile memory technology that is capable of keeping data units in finer grained sizes than mass storage (e.g., byte addressable cache lines) and are faster than traditional mass storage technologies making them useable as system memory devices, e.g., in place of DRAM. Examples include, to name a few, phase change based memories, three dimensional crosspoint memory technology memories. In some embodiments, three dimensional crosspoint memory may comprise a transistor-less stackable cross point architecture in which memory cells sit at the intersection of word lines and bit lines and are individually addressable and in which bit storage is based on a change in bulk resistance.

Thus, a memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product.

Note that many of the emerging non-volatile memory devices mentioned above are three dimensional which adds an extra dimension to the lowest level of granularity. For example, within any bank, instead of just row and column location definition there may be row, column and a z height location definition. Mirroring or ECC information may be implemented that contemplates the extra dimension. At higher levels of granularity, e.g., bank and higher, the same schemes as described above for two-dimensional DRAM may be used (albeit potentially with more total storage per bank).

Figure 5:
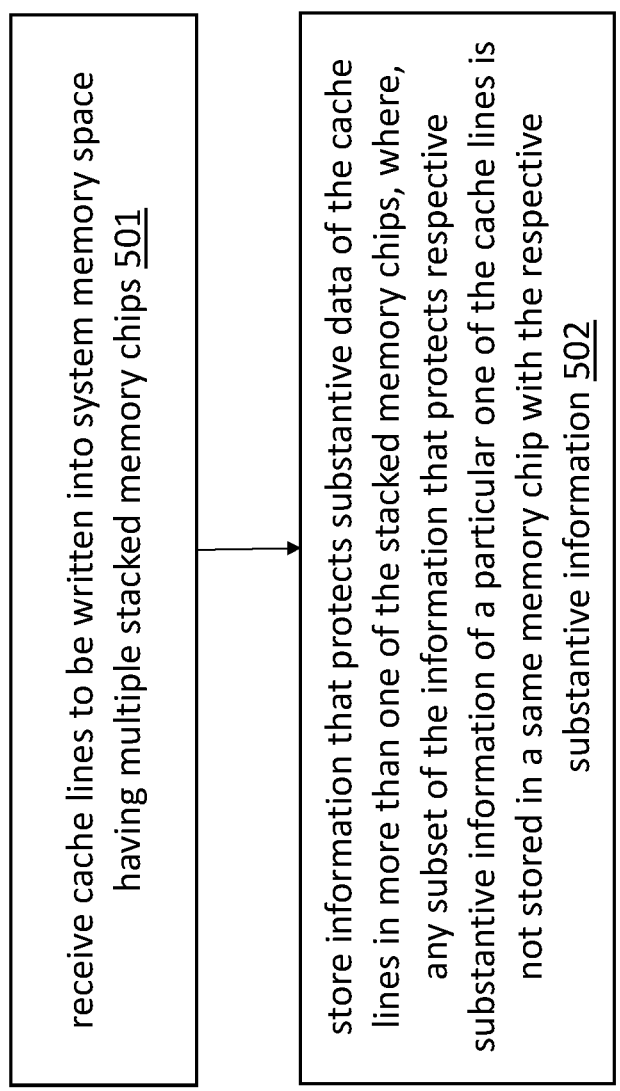
FIG. 5 shows a method of writing data into a stacked memory chip device.

FIG. 5 shows a method described above. The method includes receiving cache lines to be written into system memory space having multiple stacked memory chips 501. The method also includes storing information that protects substantive data of the cache line in more than one of the stacked memory chips, where, any subset of the information that protects respective substantive information of a particular one of the cache lines is not stored in a same memory chip with the respective substantive information 502.

Figure 6:
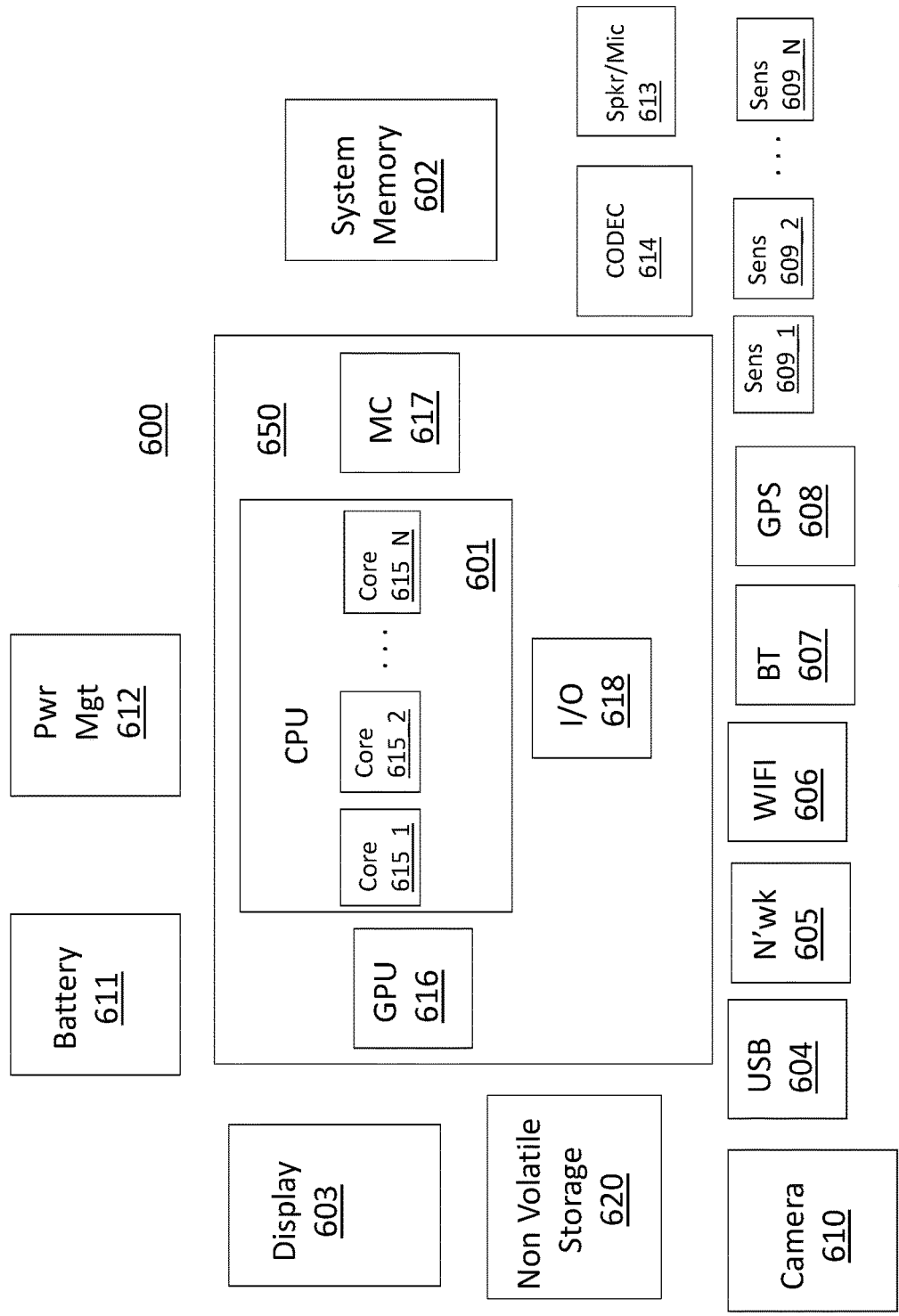
FIG. 6 shows a computing system

FIG. 6 shows a depiction of an exemplary computing system 600 such as a personal computing system (e.g., desktop or laptop) or a mobile or handheld computing system such as a tablet device or smartphone, or, a larger computing system such as a server computing system.

As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603. The memory control function 617, which may be referred to as a main memory controller or system memory controller, interfaces with the system memory 602. The system memory 602 may include a memory device having stacked memory chips as described at length above.

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650. Non-volatile storage 620 may include non-volatile mass storage which may be implemented with a stacked memory device as described above. Non-volatile storage 620 may hold the BIOS and/or firmware of the computing system.

One or more various signal wires within the computing system, e.g., a data or address wire of a memory bus that couples the main memory controller to the system memory, may include a receiver that is implemented as decision feedback equalizer circuit that internally compensates for changes in electron mobility as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

The invention claimed is:

1. A stacked memory chip device, comprising:
   a plurality of stacked memory chips;
   read/write logic circuitry to service read/write requests for cache lines kept within the plurality of stacked memory chips;
   data protection circuitry to store information to protect substantive data of cache lines in the plurality of stacked memory chips, where, the information is kept in more than one of the plurality of stacked memory chips, and where, any subset of the information that protects respective substantive data of a particular one of the cache lines is not stored in a same memory chip with the respective substantive data, the information to protect the substantive data of the cache lines being one of mirroring information and ECC information.

2. The stacked memory chip device of claim 1 where the information is to be stored at row/column granularity.

3. The stacked memory chip device of claim 1 where the information is to be stored at bank granularity.

4. The stacked memory chip device of claim 1 wherein the information is to be stored in a region of the plurality of memory chips that is reserved for storage of respective information to protect respective substantive data of multiple cache lines.

5. The stacked memory chip device of claim 4 wherein the information is to be stored in a channel that is reserved for storage of respective information to protect respective substantive data of multiple cache lines.

6. The stacked memory chip device of claim 4 wherein the information is to be stored in a particular one of the stacked memory chips that is reserved for storage of respective information to protect substantive data of multiple cache lines.

7. The stacked memory chip device of claim 1 wherein the stacked memory chips are DRAM memory chips.

8. The stacked memory chip device of claim 1 wherein the stacked memory chips are non-volatile system memory chips.

9. The stacked memory chip device of claim 1 wherein the information is mirroring information.

10. The stacked memory chip device of claim 1 wherein the information is error correction coding (ECC) information.

11. The stacked memory chip device of claim 1 further comprising error correction coding circuitry to determine said information from said substantive data.

12. The stacked memory chip device of claim 1 wherein the stacked memory chips are DRAM memory chips.

13. The stacked memory chip device of claim 1 wherein the stacked memory chips are non-volatile system memory chips.

14. A computing system, comprising:
a plurality of processing cores;
a system memory controller coupled to the plurality of processing cores;
a system memory coupled to the system memory controller, the system memory comprising a stacked memory chip device, the stacked memory chip device comprising a), b) and c) below:
a) a plurality of stacked memory chips;
b) read/write logic circuitry to service read/write requests for cache lines kept within the plurality of stacked memory chips;
c) data protection circuitry to store information to protect substantive data of cache lines in the plurality of stacked memory chips, where, the information is kept in more than one of the plurality of stacked memory chips, and where, any subset of the information that protects respective substantive data of a particular one of the cache lines is not stored in a same memory chip with the respective substantive data, the information to protect the substantive data of the cache lines being one of mirroring information and ECC information.

15. The computing system of claim 14 where the information is to be stored at any of:
row/column granularity;
bank granularity.

16. The stacked memory chip device of claim 14 wherein the information is to be stored in a region of the plurality of stacked memory chips that is reserved for storage of respective information to protect respective substantive data of multiple cache lines.

17. The stacked memory chip device of claim 16 wherein the information is to be stored in a particular one of the stacked memory chips that is reserved for storage of respective information to protect substantive data of multiple cache lines.

18. A method, comprising:
receiving cache lines to be written into system memory space comprising multiple stacked memory chips;
storing information that protects substantive data of the cache lines in more than one of the stacked memory chips, where, any subset of the information that protects respective substantive data of a particular one of the cache lines is not stored in a same memory chip with the respective substantive data, the information to protect the substantive data of the cache lines being one of mirroring information and ECC information.

19. The method of claim 18 wherein the information is mirroring information.

20. The method of claim 18 wherein the information is ECC information.

* * * * *